(12) United States Patent
Tauscher et al.

(10) Patent No.: US 9,946,062 B1
(45) Date of Patent: Apr. 17, 2018

(54) MICROELECTROMECHANICAL SYSTEMS (MEMS) SCANNERS FOR SCANNING LASER DEVICES

(71) Applicant: Microvision, Inc., Redmond, WA (US)

(72) Inventors: Jason B. Tauscher, Sammamish, WA (US); Wyatt O. Davis, Bothell, WA (US); Dean R. Brown, Lynwood, WA (US); Mark P. Helsel, Seattle, WA (US); Quinn William Haynie, Redmond, WA (US); Matthieu Saracco, Redmond, WA (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 15/370,429

(22) Filed: Dec. 6, 2016

(51) Int. Cl.
*G02B 26/12* (2006.01)
*G02B 26/08* (2006.01)
*B81B 5/00* (2006.01)
*G02B 26/10* (2006.01)

(52) U.S. Cl.
CPC ............ *G02B 26/0833* (2013.01); *B81B 5/00* (2013.01); *G02B 26/105* (2013.01); *B81B 2201/042* (2013.01)

(58) Field of Classification Search
CPC .. G02B 26/101; G02B 26/105; G02B 26/085; G02B 26/0858; G02B 26/0841

USPC ........................................................ 359/198.1
See application file for complete search history.

(56) References Cited

U.S. PATENT DOCUMENTS

| | | | |
|---|---|---|---|
| 2015/0203346 A1* | 7/2015 | Fujimoto | G02B 26/085 74/1 SS |
| 2015/0277105 A1* | 10/2015 | Park | G02B 26/085 359/212.2 |
| 2016/0033761 A1* | 2/2016 | Murayama | G02B 26/085 359/199.3 |
| 2017/0004971 A1* | 1/2017 | Kim | H01L 21/2658 |

* cited by examiner

*Primary Examiner* — Mohammed Hasan
(74) *Attorney, Agent, or Firm* — Kevin D. Wills

(57) ABSTRACT

The embodiments described herein provide microelectromechanical system (MEMS) scanners with increased resistance to distortion in the mirror surface. Such MEMS scanners, when incorporated into laser scanning devices, are used to reflect laser light into a pattern of scan lines. Thus, by reducing distortion in the scanning surface these MEMS scanners can provide improved performance in scanning laser devices, including scanning laser projectors and laser depth scanners. In general, this is accomplished by providing a MEMS scanner where the connection to the scan plate is made at an intermediate support structure, and at a point on that intermediate support structure that is offset from the scanning surface. Providing the connection to the scan plate at points offset from the scanning surface can reduce the distortion that occurs in the scanning surface as a result of rotational forces in the MEMS scanner.

16 Claims, 13 Drawing Sheets

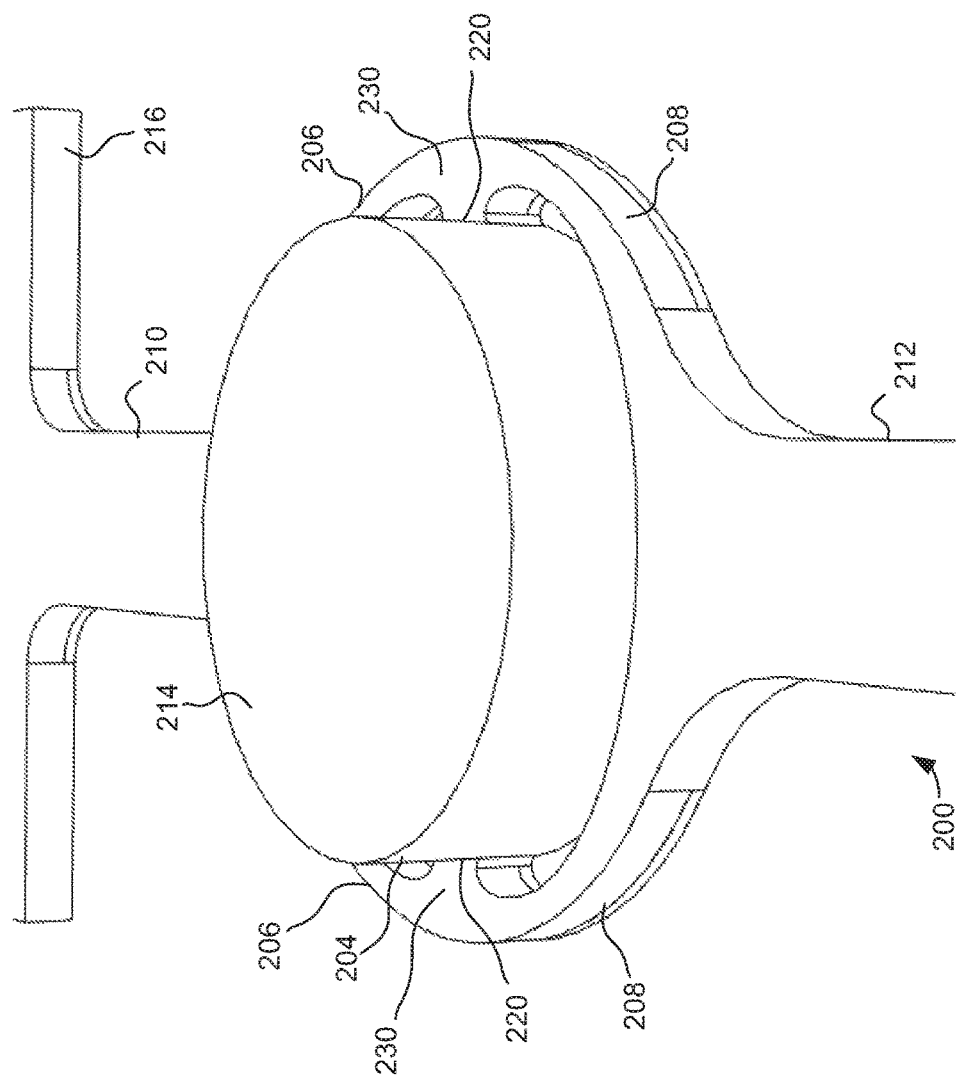

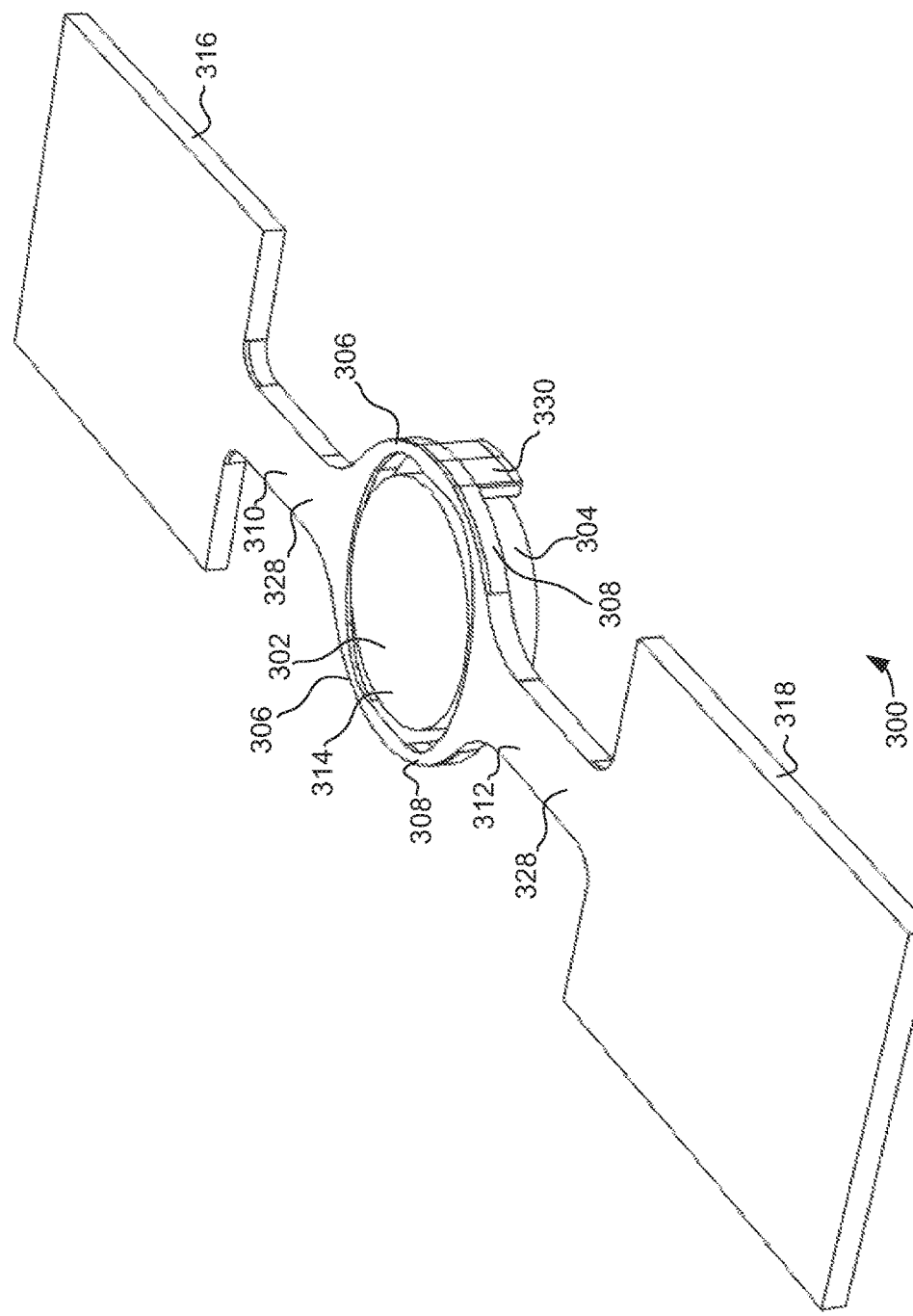

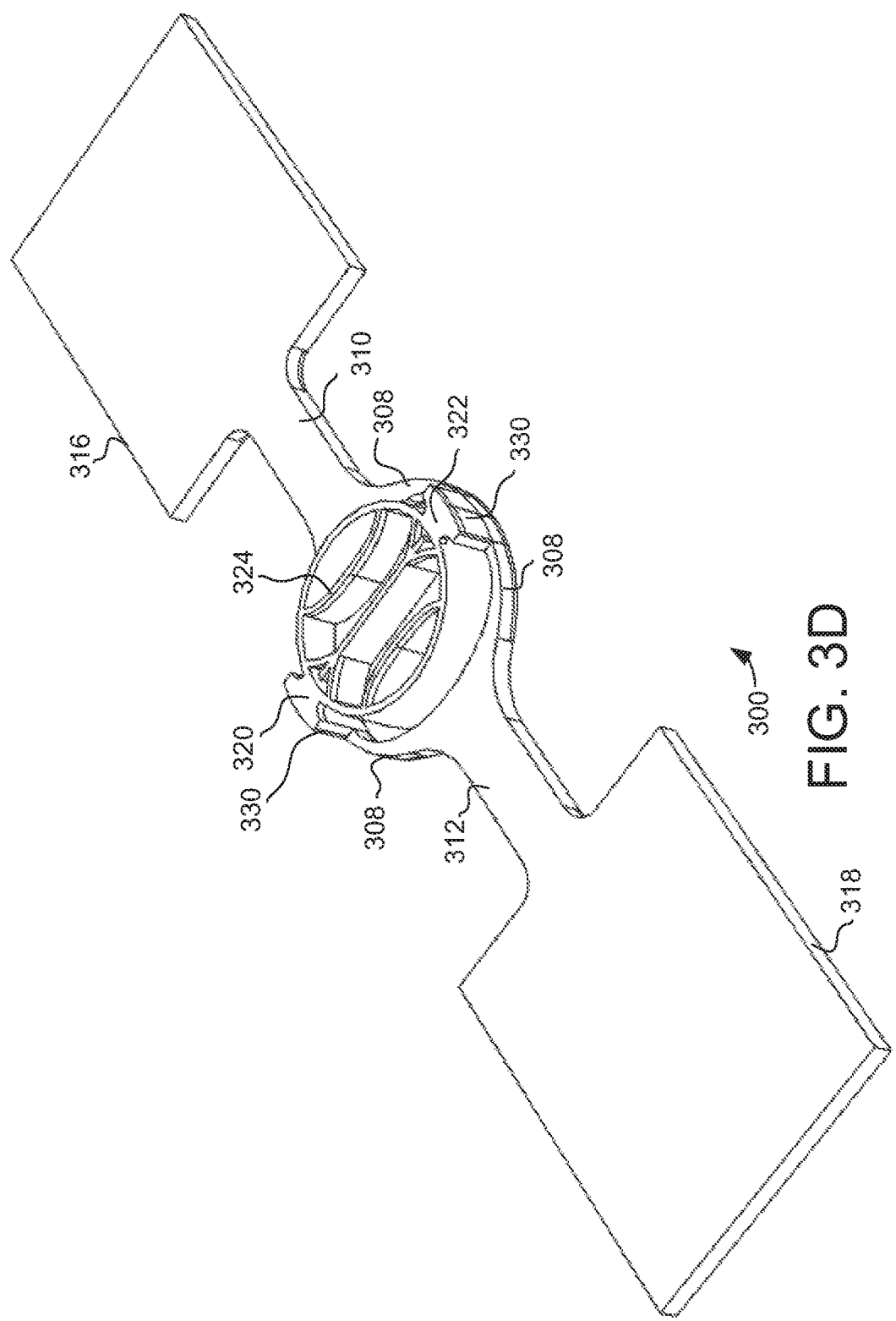

MICROELECTROMECHANICAL SYSTEMS (MEMS) SCANNERS FOR SCANNING LASER DEVICES

FIELD

The present disclosure generally relates to laser image projection, and more particularly relates to microelectromechanical systems (MEMS) scanners used in scanning laser devices.

BACKGROUND

In scanning laser devices, laser light is reflected off one or more scanning mirrors to generate a scanning pattern. For example, in scanning laser projectors, images are projected by scanning laser light into a pattern with a scanning mirror, with individual pixels generated by modulating the laser light. Similarly, laser depth scanners generate depth maps by scanning laser light into a pattern with a scanning mirror and measuring the laser light reflected back.

One issue with both scanning laser devices is the continuing need to reduce distortion in the scanning mirrors. Specifically, as a scanning mirror rotates forces are applied to the mirror and these forces can cause distortions in the mirror surface. Furthermore, as mirror rotation angles and/or speed has increased in modern devices the forces applied to the mirror have also increased. These increased forces can result in increased distortions in the mirror surface. When such distortions are large enough the resulting scanning pattern can be distorted and image quality can be noticeably reduced. Thus, there is a need for devices and methods for reducing the mirror distortion in scanning laser devices.

BRIEF DESCRIPTION OF THE DRAWINGS

FIGS. 2A, 2B, 2C, 2D and 2E illustrate perspective views of a MEMS scanner in accordance with an embodiment of the present invention;

FIGS. 3A, 3B, 3C, 3D and 3E illustrates perspective views of a MEMS scanner in accordance with an embodiment of the present invention;

DESCRIPTION OF EMBODIMENTS

The embodiments described herein provide improved scanning mirrors that can provide reduced distortion in the mirror surface. Specifically, the embodiments described herein provide microelectromechanical system (MEMS) scanners with an offset connection to an intermediate structure that provides increased resistance to distortion in the mirror surface. Such MEMS scanners, when incorporated into laser scanning devices, are used to reflect laser light into a pattern of scan lines. Thus, by reducing distortion in the scanning surface these MEMS scanners can provide improved performance in scanning laser devices, including scanning laser projectors and laser depth scanners, LIDAR systems, 3D motion sensing devices, gesture recognition devices, etc. Examples of such scanning laser projectors include traditional image projectors, head-up displays (HUD), and helmet mounted displays (HMD).

In general, this reduced distortion is accomplished by providing a MEMS scanner where the connection to the scan plate is made at an intermediate support structure, and at a point on that intermediate support structure that is offset from the scanning surface. Providing the connection to the scan plate at points offset from the scanning surface can reduce the distortion that occurs in the scanning surface as a result of rotational forces in the MEMS scanner.

Figure 1:
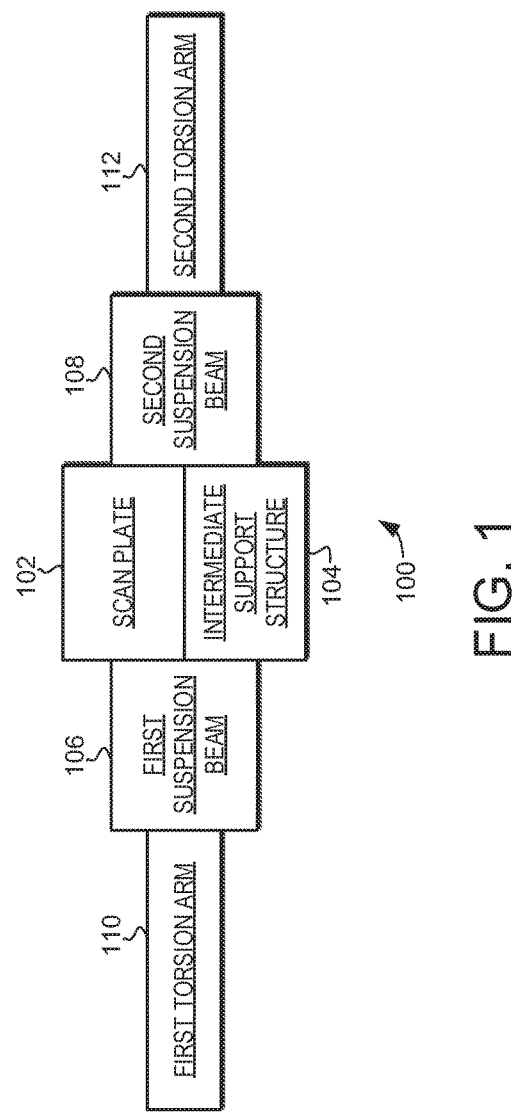
FIG. 1 shows a schematic diagram of MEMS scanner in accordance with various embodiments of the present invention.

Turning now to FIG. 1, an exemplary MEMS scanner 100 is illustrated schematically. The MEMS scanner includes a scan plate 102, an intermediate support structure 104, a first suspension beam 106, a second suspension beam 108, a first torsion arm 110, and a second torsion arm 112. The scan plate 102 includes a scanning surface configured to reflect laser light in a scanning laser device. The intermediate support structure 104 extends from the scan plate 102 and is configured to stiffen the scan plate 102. The first torsion arm 110 and the second torsion arm 112 provide for rotational movement of the scan plate, and the first suspension beam 106 and second suspension beam 108 provide the connection to the first torsion arm 110 and second torsion arm 112 respectfully.

In accordance with the embodiments described herein, the MEMS scanner 100 is formed such that the first suspension beam 106 is coupled to the intermediate support structure 104 at a first point that is offset from the scanning surface. Likewise, the second suspension beam 108 is coupled to the intermediate support structure 104 at a second point that is offset from the scanning surface. Providing the connections to the intermediate support structure 104 at points offset from the scanning surface can reduce the distortion that would otherwise occur in the scanning surface as a result of rotational forces in the MEMS scanner 100.

In one embodiment, the offset of the points of connection can be provided by offsetting the scanning surface from the suspension beams 106 and 108. This can additionally offset the scanning surface from a surface of the torsion arms 110 and 112. In one embodiment, the vertical offset of the points of connection to the scanning surface is greater than 10% of the scanning surface diameter. A detailed example of such an embodiment will be discussed with reference to FIG. 2.

In another embodiment, the offset of the points of connection can be provided by additionally providing a suspension connector structure. In one embodiment, this offset of the points of connection to the scanning surface is greater than 10% of the scanning surface diameter. In this embodiment, the suspension connector structure provides the total equivalent mechanical length of the offset, but the scanning surface can be coplanar with a front surface of the suspension beam 106 and 108 and the torsion arms 110 and 112. A detailed example of such an embodiment will be discussed with reference to FIG. 3.

The MEMS scanner 100 is formed from a semiconductor substrate using MEMS techniques, including photolithography and micromachining. Thus, the scan plate 102, the intermediate support structure 104, the first suspension beam 106, the second suspension beam 108, the first torsion arm 110, and the second torsion arm 112 are all formed from the same substrate using MEMS techniques. In a typical embodiment, the MEMS scanner 100 would be photolithographically formed from single-crystal silicon. However, use of polycrystalline silicon or combination of single and polycrystalline silicon can also be used to achieve the desired structures. In yet other embodiments, other materials such as gallium arsenide (GaAs) or silicon carbide (SiC) can be used.

In such techniques, MEMS scanners 100 can be patterned from a single wafer using a variety of photolithographic techniques, and then the individual scanners separated and removed. These techniques can also include the deposition and patterning of metallization to form conductive traces, contacts and other such elements. Finally, the scanning surface can be made reflective through the selective deposition of materials on the scanning surface.

As was mentioned above, the MEMS scanner 100 can be implemented in scanning laser devices, including scanning laser projectors and laser depth scanners. In such an embodiment, the scanning laser device can be implemented with a drive circuit configured to provide drive signals to one or more MEMS actuators, where MEMS actuators generate motion in the MEMS scanner 100 in response to the those drive signals. In making such an implementation, any suitable actuation technique can be used. For example, in one embodiment, the drive circuit provides drive signals to a coil in the presence of an applied magnetic field, and this excites motion of the scanning surface. Other embodiments might employ other appropriate actuation schemes including, piezo, electrostatic, or any other methodology capable of providing the required mechanical force. In all cases, the resulting motion of the scanning surface reflects laser light into a pattern of scan lines, and thus can facilitate image projection, depth scanning, or any other suitable laser scanning function.

In one specific embodiment that will be described in greater detail below, the MEMS scanner 100 is implemented in a scanning laser device that uses two mirrors for laser scanning. In such a device a first mirror can be configured to deflect along one axis and a second mirror configured to deflect along a second axis that is largely perpendicular to the first axis. Furthermore, in such a device the first mirror can be used for relatively fast scan motion, while the second mirror is used for relatively slow scan motion. The MEMS scanner 100 can thus be implemented to provide either the relatively fast scan motion or the relatively slow scan motion. In one specific embodiment, the relatively fast scan motion comprises resonant sinusoidal motion while the relatively slow scan motion comprises non-resonant controlled motion.

One issue with relatively fast scan motion is the resulting increase in strain and other forces on the scanning surface. Because the MEMS scanner 100 is highly resistant to distortion in the scanning surface, the MEMS scanner 100 is particularly well adapted to providing fast scan motion. Again, examples of such an implementation will be described in greater detail below. However, the MEMS scanner 100 can also be used to provide slow scanning motion as well.

Figure 2A:
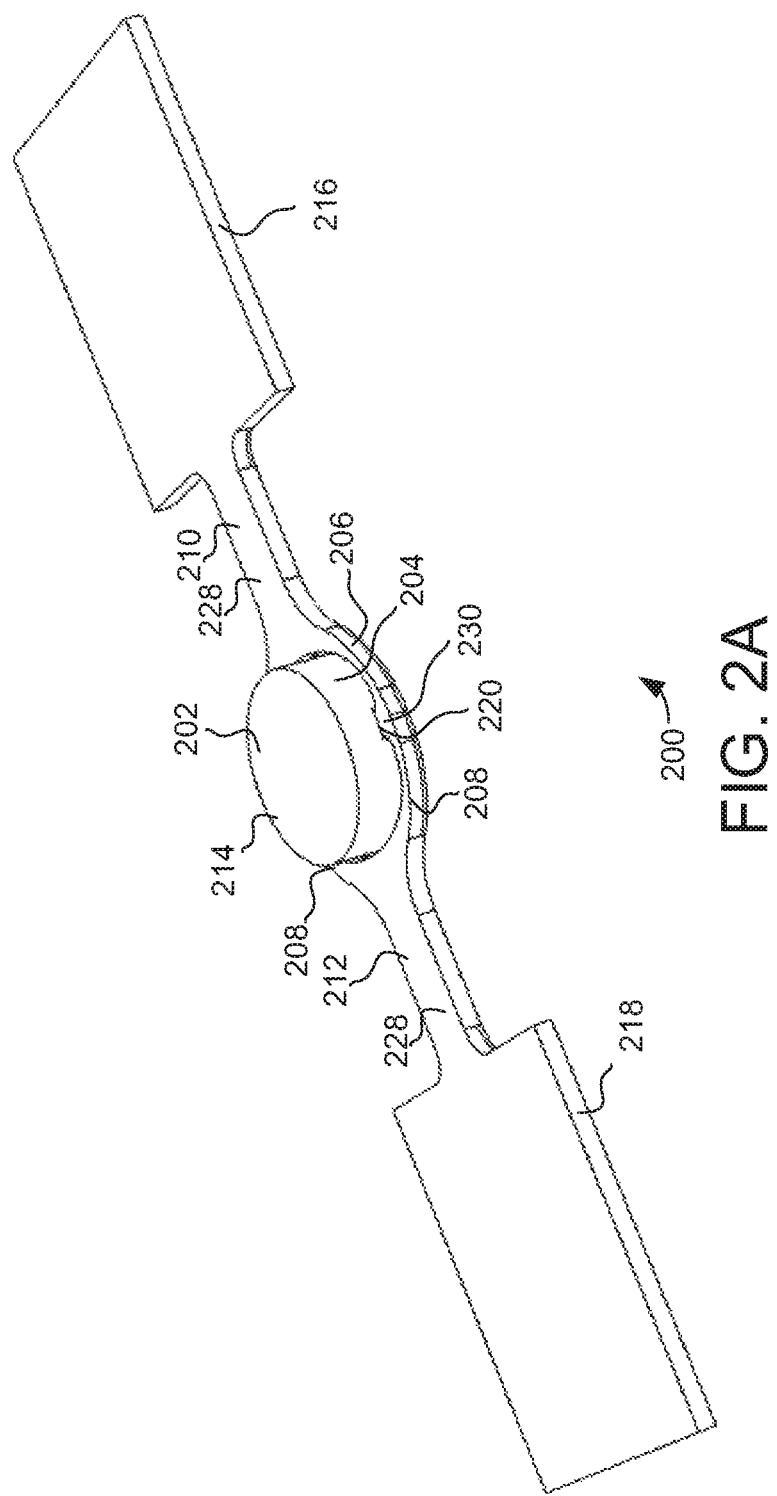
Figure 2B:
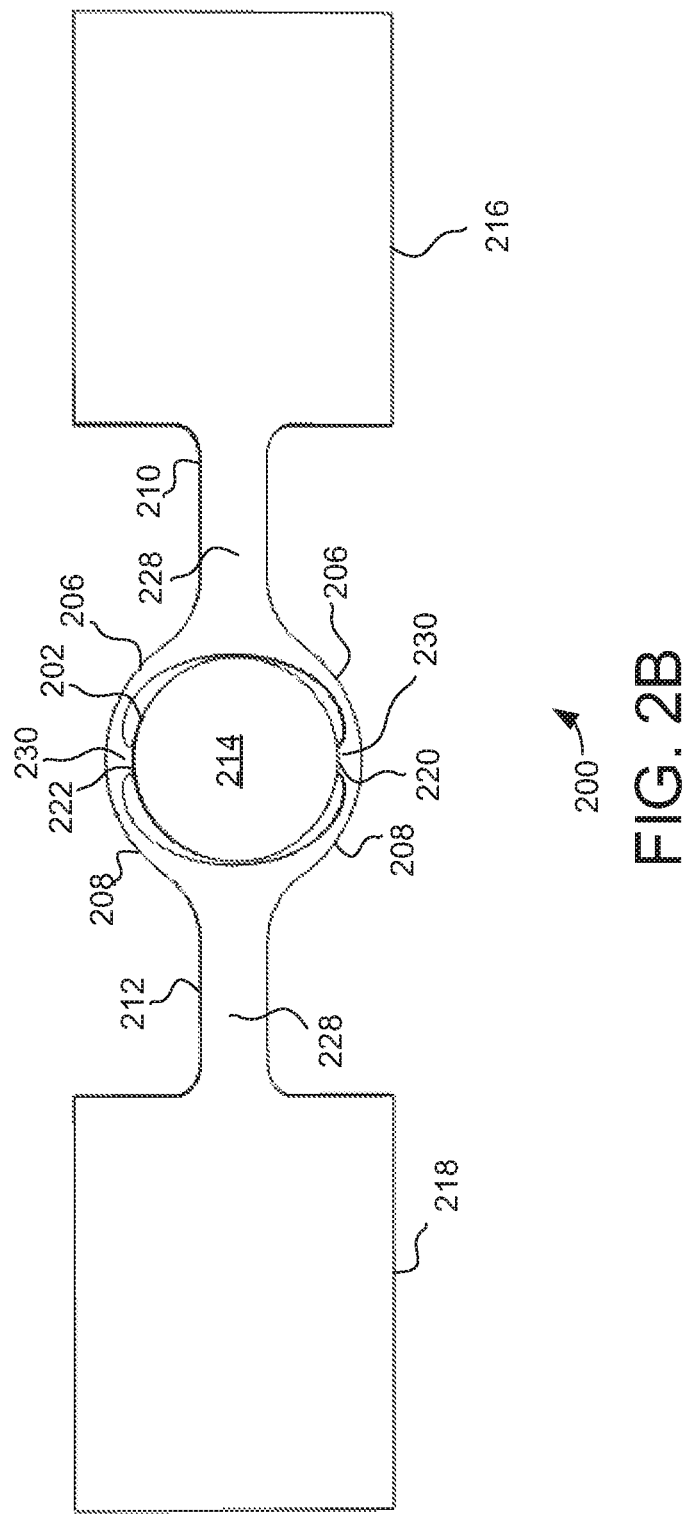
Figure 2C:
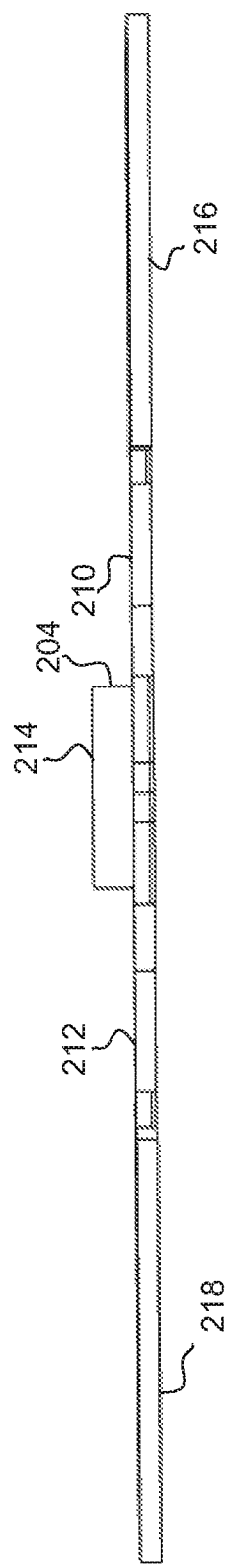
Figure 2D:
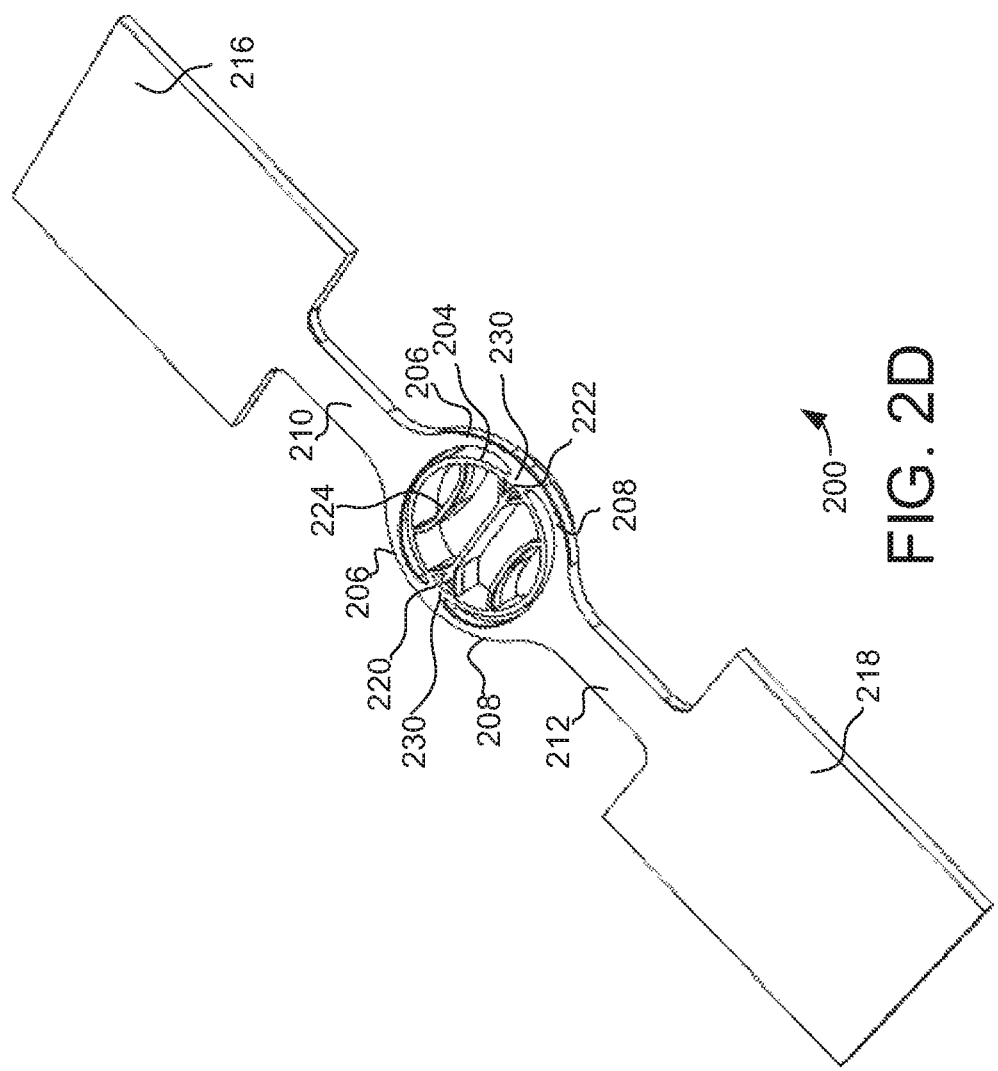

Turning now to FIGS. 2A, 2B, 2C, 2D and 2E, five perspective views of an exemplary MEMS scanner 200 are illustrated. The MEMS scanner 200 includes a scan plate 202, an intermediate support structure 204, a first suspension beam 206, a second suspension beam 208, a first torsion arm 210, and a second torsion arm 212. Also included are a first mounting tab 216 and a second mounting tab 218. The scan plate 202 includes a scanning surface 214 configured to reflect laser light in a scanning laser device. The intermediate support structure 204 extends from the scan plate 202 and is configured to stiffen the scanning surface 214 of the scan plate 202. As can be seen in FIG. 2D, the underside of the intermediate support structure 204 also includes a plurality of ribs 224. These ribs 224 are under the scan plate 202 to provide additional stiffness to the scanning surface 214 without excessive weight. Notably, in this embodiment the ribs 224 are arranged in a direction perpendicular to the rotation axis of the torsion arms 210 and 212.

The first torsion arm 210 and the second torsion arm 212 allow rotational movement of the scan plate, and the first suspension beam 206 and second suspension beam 208 provide the connection to the first torsion arm 210 and second torsion arm 212 respectfully.

In accordance with the embodiments described herein, the MEMS scanner 200 is formed such that the first suspension beam 206 is coupled to the intermediate support structure 204 at points that are offset vertically from the scanning surface 214. Likewise, the second suspension beam 208 is coupled to the intermediate support structure 204 at points that are offset from the scanning surface 214. Notably, in this embodiment both the first suspension beam 206 and the second suspension beam 208 are coupled to the intermediate support structure 204 at the same points. Also, notably in this embodiment both the first suspension beam 206 and the second suspension beam 208 are coupled through suspension connector structures 230.

Specifically, in this illustrated embodiment the first suspension beam 206 is coupled to the intermediate support structure 204 at a first point 220 and a second point 222. Likewise, the second suspension beam 208 is coupled to the intermediate support structure 204 at the first point 220 and the second point 222. It should be noted having both suspension beams 206 and 208 coupled to the same points on the intermediate support structure 204 and through the same suspension connector structures is not required, and in other embodiments each suspension beam could be coupled at different points on the intermediate support structure 204 and with a different number of connection points.

In one specific embodiment, the first point 220 and the second point 222 are both offset from the scanning surface 214 a distance corresponding to 10% of the scanning surface 214 diameter. As one specific example, the offset can again be at least 0.2 mm. Also in this embodiment, the front surfaces of the suspension connector structures 230 (where the front surfaces are those on the same side as the scanning surface 214) are coplanar with the first point 220 and second point 222 and are thus also offset from the scanning surface 214. Also it should be noted that in this illustrated embodiment the scanning surface 214 is also offset from a front surface 228 of the first and second torsion arms 210 and 212.

Again, providing the connections to the intermediate support structure 204 at points 220 and 222 that offset from the scanning surface 214 can reduce the distortion that would otherwise occur in the scanning surface 214 as a result of rotational forces in the MEMS scanner 200.

In MEMS scanner 200 the scan plate 202 and intermediate support structure 204 each have perimeter. In the illustrated embodiment, the perimeter is a circular perimeter, but other embodiments can have different configurations. The first torsion arm 210, the first suspension beam 206, the second torsion arm 212, and the second suspension beam 208 together surround this perimeter of the intermediate support structure 204. Furthermore, the connection points 220 and 222 are located on opposite sides of the intermediate support structure 204, and at orthogonal positions relative to the axis of the torsion arms 210 and 212. Taken together, this arrangement can greatly reduce the rotational stress in the mechanical linkage between the connection points 220 and 222 and the intermediate support structure 204 which may be advantageous in some instances.

MEMS scanner 200 is formed from a single substrate using MEMS techniques. Thus, the scan plate 202, the intermediate support structure 204, the first suspension beam 206, the second suspension beam 208, the first torsion arm 210, the second torsion arm 212 are all formed from the same substrate using MEMS techniques. Again, in a typical embodiment, the MEMS scanner 200 would be photolithographically formed from single or poly crystal silicon, while the scanning surface 214 can be made reflective through the selective deposition of materials on the scanning surface 214.

Figure 3B:
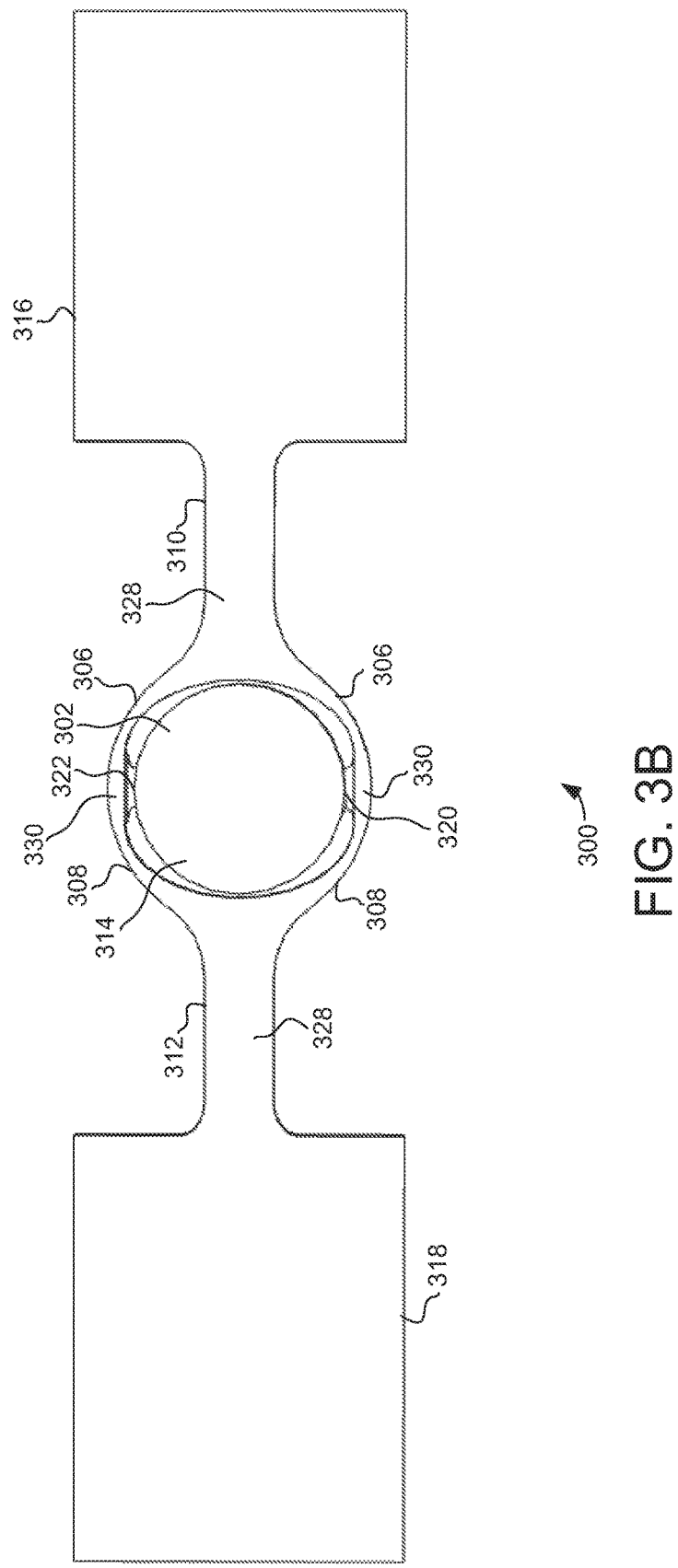
Figure 3C:
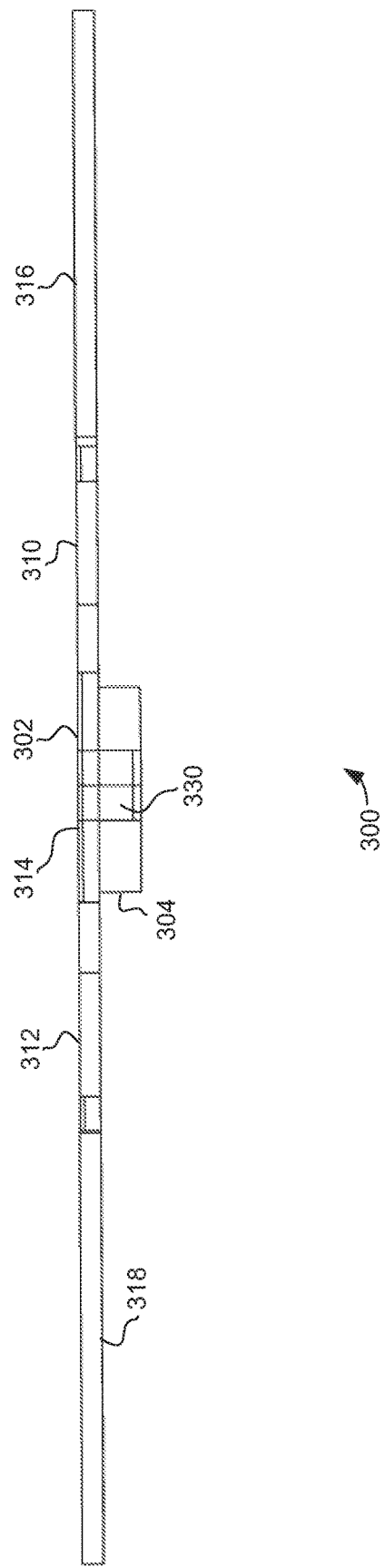
Figure 3E:
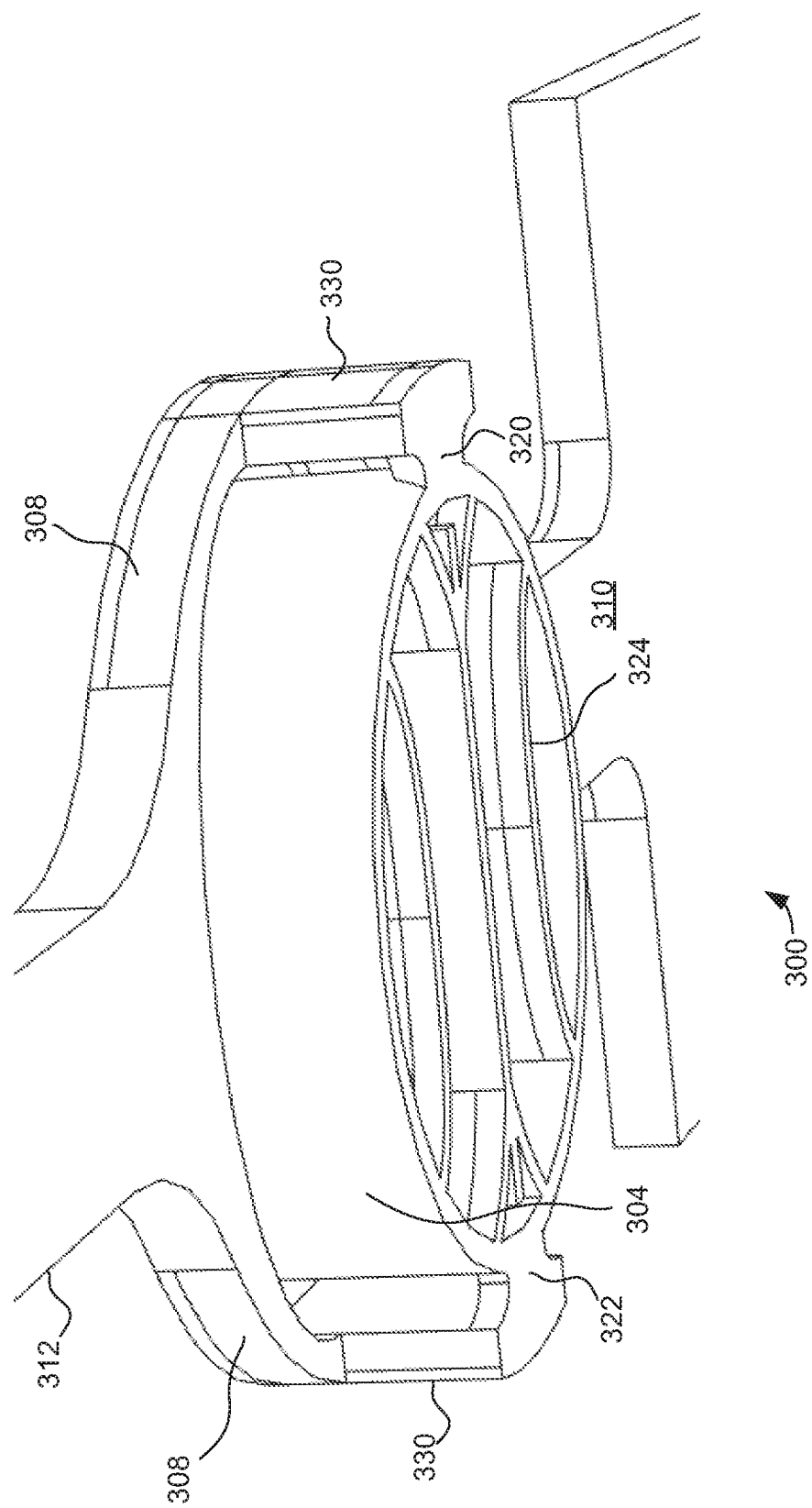

Turning now to FIGS. 3A, 3B, 3C, 3D, and 3E, five perspective views of an exemplary MEMS scanner 300 are illustrated. The MEMS scanner 300 includes a scan plate 302, an intermediate support structure 304, a first suspension beam 306, a second suspension beam 308, a first torsion arm 310, and a second torsion arm 312. Also included are a first mounting tab 316 and a second mounting tab 318. The scan plate 302 includes a scanning surface 314 configured to reflect laser light in a scanning laser device. The intermediate support structure 304 extends from the scan plate 303 and is configured to stiffen the scanning surface 314 of the scan plate 302. As can be seen in FIG. 3B, the underside of the intermediate support structure 304 also includes a plurality of ribs 324. Again, these ribs 324 are configured under the scan plate 302 to provide additional stiffness to the scanning surface 314 without excessive weight. Notably, in this embodiment the ribs 324 are arranged in a direction perpendicular to the rotation axis of the torsion arms 310 and 312.

The first torsion arm 310 and the second torsion arm 312 allow rotational movement of the scan plate, and the first suspension beam 306 and second suspension beam 308 provide the connection to the first torsion arm 310 and second torsion arm 313 respectfully.

In accordance with the embodiments described herein, the MEMS scanner 300 is formed such that the first suspension beam 306 is coupled to the intermediate support structure 304 at points that are offset from the scanning surface 314. Likewise, the second suspension beam 308 is coupled to the intermediate support structure 304 at points that are offset from the scanning surface 314. Again, in this embodiment both the first suspension beam 306 and the second suspension beam 308 are coupled to the intermediate support structure 304 at the same points. Also, notably in this embodiment both the first suspension beam 306 and the second suspension beam 308 are coupled through suspension connector structures 330.

Specifically, in this illustrated embodiment the first suspension beam 306 is coupled to the intermediate support structure 304 at a first point 320 and a second point 322. Likewise, the second suspension beam 308 is coupled to the intermediate support structure 304 at the first point 320 and the second point 322. Again, it should be noted having both suspension beams 306 and 308 coupled to the same points on the intermediate support structure 304 and through the same suspension connector structures is not required, and in other embodiments each suspension beam could be coupled at different points on the intermediate support structure 304 and with a different number of connection points. In this embodiment, reduced translation of rotational stress to the scanning surface 314 and support structure 304 is provided by changing the vector of the applied forces to the support structure 304.

In one specific embodiment, the first point 320 and the second point 323 are both offset from the scanning surface 314 a distance corresponding to 10% of the scanning surface 314 diameter. As one specific example, the offset can be at least 0.2 mm. Also in this embodiment, the front surfaces of the suspension connector structures 330 are also offset from the scanning surface by a distance corresponding to 10% of the scanning surface 314 diameter. As one specific example, the offset can again be at least 0.2 mm.

However, in contrast with the embodiment of FIG. 2, in this embodiment the scanning surface 314 is not offset from a front surface 328 of the first and second torsion arms 310 and 312. Such an embodiment may provide various benefits including but not limited to, improved manufacturability by defining the scanning surface 314 and torsion arms 310 and 312 in the same silicon layer, less offset of the scanning surface 314 from the axis of rotation, or a more balanced center of mass.

Again, providing the connections to the intermediate support structure 304 at points 320 and 322 that offset from the scanning surface 314 can reduce the distortion that would otherwise occur in the scanning surface 314 as a result of rotational forces in the MEMS scanner 300.

In MEMS scanner 300 the scan plate 302 and intermediate support structure 304 each have perimeter, and more specifically a circular perimeter. The first torsion arm 310, the first suspension beam 306, the second torsion arm 313, and the second suspension beam 308 together surround this perimeter of the intermediate support structure 304. Furthermore, the connection points 320 and 322 are located on opposite sides of the intermediate support structure 304, and at orthogonal positions relative to the axis of the torsion arms 310 and 312. Taken together, this arrangement can provides increased stiffness to the MEMS scanner 300, including the scanning surface 314 and suspension beams 306 and 308.

Like the previous embodiment, the MEMS scanner 300 is formed from a single common and unitary substrate using MEMS techniques. Thus, the scan plate 302, the intermediate support structure 304, the first suspension beam 306, the second suspension beam 308, the first torsion arm 310, the second torsion arm 312 are all formed from the same substrate using MEMS techniques.

The example embodiments of FIGS. 2A-2E and 3A-3E can include other features not illustrated in those figures. For example, the coil traces may be provided to interact with applied magnetic fields and generate motion. In other embodiments, features may be provided to facilitate piezoelectric actuation. Additionally, electrical contracts can be formed to provide electrical connection between the MEMS scanners and an attached die carrier. For example, such contacts can be configured to provide electrical connection to elements such as sensors.

As one detailed example, during operation a drive circuit (not shown in FIGS. 2 and 3) can provide drive signals to one or more coil traces. Those drive signals create electromagnetic interactions between the coil traces and an applied magnetic field, and those interactions excite motion of the scan plate (e.g., scan plate 102, 202, 302). This resulting motion of the scan plate can be configured to reflect laser light into a pattern of scan lines, and thus can facilitate laser scanning.

As another detailed example, during operation a drive circuit can provide drive signals to one or more piezoelectric actuators, which in turn generate motion in the scan plate. This resulting motion of the scan plate can be configured to reflect laser light into a pattern of scan lines, and thus can facilitate laser scanning.

In some embodiments the MEMS scanner may also incorporate one or sensors. For example, the MEMS scanner may also include one or more integrated piezoresistive position sensors. These piezoresistive sensors can be configured to produces a voltage that represents the displacement of scan plate, and this voltage can be provided as feedback to the drive circuit.

The MEMS scanners 100, 200 and 300 can be implemented in variety of scanning laser devices, including scanning laser projectors and laser depth scanners. For example, the MEMS scanners can be implemented as part of a scanning laser device to provide relatively fast, resonant motion, while a relatively slow scan motion is provided by another mirror.

Figure 4:
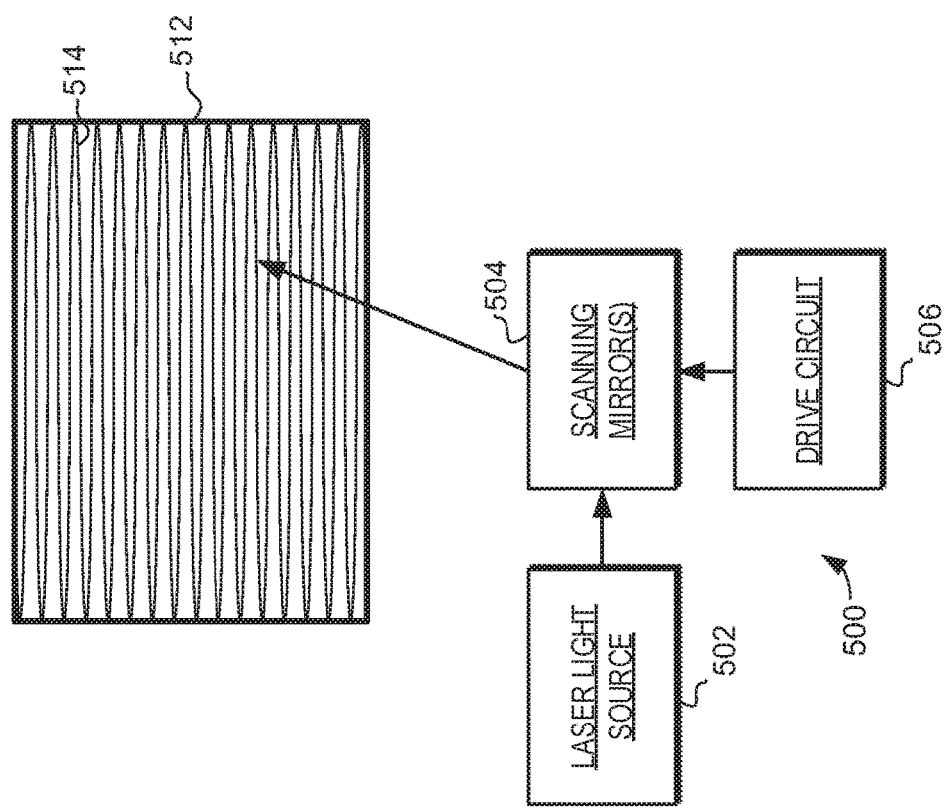
FIG. 4 shows a schematic view of a scanning laser device in accordance with various embodiments of the present invention.

Turning now to FIG. 4, a schematic diagram of a scanning laser device 500 is illustrated. The scanning laser device 500 includes a laser light source 502, scanning mirror(s) 504 and a drive circuit 506. During operation, the laser light source 502 generates at least one beam of laser light that is reflected by the scanning mirror(s) 504 into a pattern 514 of scan lines inside a scanning region 512. In the example of FIG. 4, the pattern 514 of scan lines comprises a raster pattern. However, this is just one example, and in other embodiments other patterns of scan lines can be generated as used. For example, spiral patterns and Lissajous patterns could instead be implemented.

To facilitate this, the drive circuit 506 controls the movement of the scanning mirror(s) 504. Specifically, the drive circuit 506 provides excitation signal(s) to excite motion of the scanning mirror(s) 504.

In accordance with the embodiments described herein, one or more of the scanning mirrors 504 is implemented with a MEMS scanner as described above (e.g., MEMS scanner 100, 200, 300, etc.). Such a scanning laser device 500 can be implemented to perform a variety of functions. For example, the scanning laser device 500 can be implemented to facilitate image projection, laser depth scanning, LIDAR, 3D motion sensing, gesture recognition, etc.

As one example, in a device implemented to provide image projection, the beam of laser light would be encoded with pixel data to generate image pixels. In another example, the laser light source 502 can include an infrared or other suitable laser that is used to generate the depth mapping pulses. Reflections of these pulses from a surface can then be received and used to generate 3-dimensional maps of the surface. For example, the depth map of the surface can be determined by calculating a time of flight for the return of each received depth mapping pulse.

Turning now to FIG. 6, a schematic view of a scanning laser projector 700 is illustrated. The scanning laser projector 700 is a more detailed example of the type of system that can be used in accordance with various embodiments of the present invention. Specifically, the scanning laser projector 700 can be implemented using the various MEMS scanners described above. In some embodiments, the scanning laser projector is implemented to provide both laser depth scanning and laser image projection, while in other embodiments only image projection is provided.

Scanning laser projector 700 includes an image processing component 702, a pixel drive generator 704, an infrared laser module 705, a red laser module 706, a green laser module 708, and a blue laser module 710. In such an embodiment the red, green and blue light can be used for image projection, while the infrared light can be used for depth scanning. Light from the laser modules is combined with dichroics 712, 714, 716, and 717. Scanning laser projector 700 also includes fold mirror 718, drive circuits 720, a first MEMS scanner assembly 722 with first scanning mirror 724, and second MEMS scanner assembly 726 with a second scanning mirror 728. It should be noted that this illustrated arrangement for combing the outputs from the various laser modules is just one example implementation, and other implementations using different techniques for combing laser light of different wavelengths can instead be used.

In operation, image processing component 702 processes video content using two dimensional interpolation algorithms to determine the appropriate spatial image content for each scan position at which an output pixel is to be displayed by the pixel drive generator 704. For example, the video content may represent a grid of pixels at any resolution (e.g., 640×480, 848×480, 1280×720, and 1920×1080). The input light intensity encoding typically represents the light intensity in 8, 10, 12 bit or higher resolutions.

This content is then mapped to a commanded current for each of the red, green, and blue laser sources such that the output intensity from the lasers is consistent with the input image content. In some embodiments, this process occurs at output pixel rates in excess of 150 MHz. The laser beams are then directed onto scanning mirrors 724 and 728. In general, the first scanning mirror 724 provides for one axis of motion (e.g., horizontal), while the second scanning mirror 728 provides for another axis of motion (e.g., vertical). In a typical implementation of such an embodiment, the second scanning mirror 728 is operated to provide the vertical scanning motion at a relatively slow scan rate, while the first scanning mirror 724 is operated to provide horizontal motion at a relatively fast scan rate. This results in the output beam 729 generating a scanning pattern 730.

To provide such a system, the rotation of the second scanning mirror 728 can be operated quasi-statically to create a vertical sawtooth raster trajectory. Conversely, the rotation of the first mirror 724 can be operated on a resonant vibrational mode of the scanning mirror 724 to create sinusoidal motion. Together, this generates both horizontal and vertical motion of the laser beam and results in the pattern 514 of scan lines.

In these embodiments, output beam 729 sweeps back and forth left-to-right in a sinusoidal pattern, and sweeps vertically (top-to-bottom) in a sawtooth pattern with the display blanked during flyback (bottom-to-top). It should be noted that the illustrated scanning pattern 730 shows a sinusoidal pattern as the beam sweeps vertically top-to-bottom, but does not show the flyback from bottom-to-top.

In other embodiments, the vertical sweep is controlled with a triangular wave such that there is no flyback. In still further embodiments, the vertical sweep is sinusoidal. Finally, the various embodiments of the invention are not limited by the waveforms used to control the vertical and horizontal sweep or the resulting raster pattern 730.

It should be noted that in some embodiments, the first MEMS scanner assembly 722 and the second MEMS scanner assembly 726 both use electromagnetic actuation. However, in other embodiments one more of the scanner assemblies can use other techniques, including electrostatic or piezoelectric actuation. Furthermore, any number of mirrors and type of mirror actuation may be employed without departing from the scope of the present invention.

The drive circuits 720 provide drive signals to mirror assemblies 722 and 726. The drive signals include excitation signals to control the motion of the scanning mirrors 724 and 728. In operation, the laser light sources produce light pulses for each output pixel and scanning mirrors 724 and 728 reflect the light pulses as the output beam 729 traverses the pattern 730. Drive circuits 720 can also receive feedback signals from MEMS mirror assemblies 722 and 726. The feedback signals can describe the driven deflection angles of the mirrors, and can be used by the drive circuit 720 to more accurately control the motion of the scanning mirror 724.

For example, the drive circuit 720 can excite resonant motion of scanning mirror 724 such that the peak amplitude of the feedback signal is constant. This provides for a stable maximum angular deflection on the fast-scan axis as shown in raster pattern 730. The excitation signal used to excite resonant motion of scanning mirror 724 can include both amplitude and a phase. Drive circuit 720 includes feedback circuit(s) that modifies the excitation signal amplitude to keep the feedback signal peak amplitude substantially constant. Additionally, the drive circuit 720 can modify the excitation signal to control the horizontal phase alignment and vertical position of the raster pattern 730.

To facilitate this, drive circuit 720 may be implemented in hardware, a programmable processor, or in any combination. For example, in some embodiments, drive circuit 720 is implemented in an application specific integrated circuit (ASIC). Further, in some embodiments, some of the faster data path control is performed in an ASIC and overall control is provided by a software programmable microprocessor.

Figure 5:
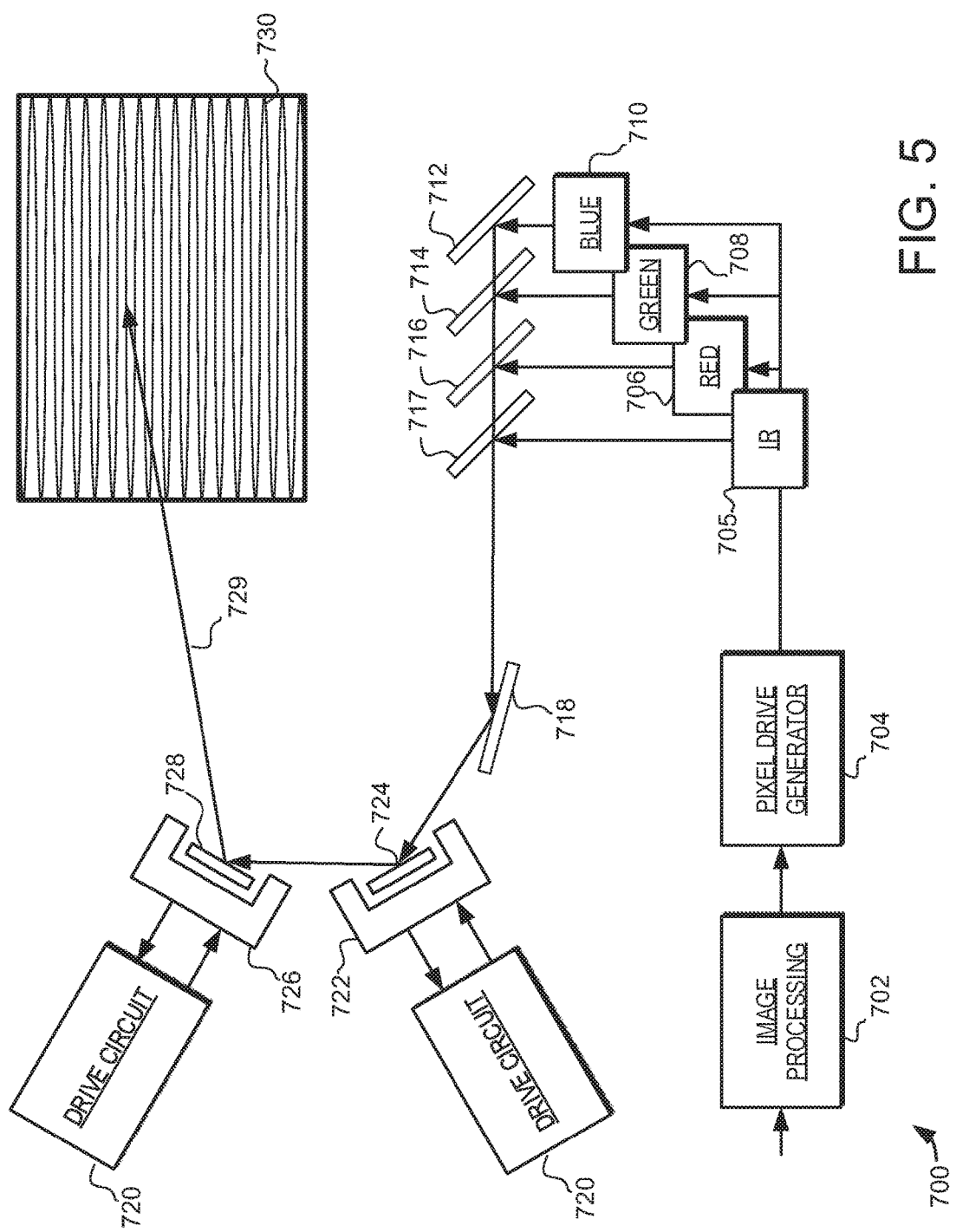
FIG. 5 shows a schematic view of a scanning laser projector in accordance with various embodiments of the present invention.

It should be noted that while FIG. 5 illustrates an embodiment with two drive circuits 720 and two MEMS scanner assemblies 722 and 726, that this is just one example implementation. As another example, a scanning laser projector could instead be implemented with fewer or more scanning mirror assemblies and mirrors.

Finally, although red, green, blue, and infrared laser light sources are shown in FIG. 6, the various embodiments are not limited to these exemplary wavelengths of laser light.

In one embodiment, a microelectromechanical systems (MEMS) scanner is provided, comprising: a scan plate, the scan plate including a scanning surface and an intermediate support structure extending away from scanning surface; a first torsion arm coupled to a first suspension beam, the first suspension beam coupled to the intermediate support structure at a first point offset from the scanning surface; a second torsion arm coupled to a second suspension beam, the second suspension beam coupled to the intermediate support structure at a second point offset from the scanning surface; and wherein the scan plate, first torsion arm, first suspension beam, second torsion arm, and second suspension beam are all formed from a unitary MEMS semiconductor substrate.

In another embodiment, a microelectromechanical systems (MEMS) scanner is provided, comprising: a scan plate, the scan plate including a scanning surface and an intermediate support structure extending away from scanning surface, the scan plate having a perimeter; a first torsion arm coupled to a first suspension beam and a second torsion arm coupled to a second suspension beam, where the first torsion arm, the first suspension beam, the second torsion arm, and the second suspension beam together extend around the perimeter of the scan plate, where the first suspension beam is coupled to the intermediate support structure at a first point offset from the scanning surface by distance greater than 0.2 mm, and where the second suspension beam is coupled to the intermediate support structure at a second point offset from the scanning surface by distance greater than 0.2 mm; and wherein the scan plate, first torsion arm, first suspension beam, second torsion arm, and second suspension beam are all formed from a unitary MEMS semiconductor substrate.

In another embodiment, a microelectromechanical systems (MEMS) scanner is provided, comprising: a scan plate, the scan plate including a scanning surface and an intermediate support structure extending away from scanning surface, the scan plate having a perimeter; a first torsion arm coupled to a first suspension beam, the first torsion arm having a front surface, and the first suspension beam having a front surface; a second torsion arm coupled to a second suspension beam, the second torsion arm having a front surface, and the second suspension beam having a front surface; where the first torsion arm, the first suspension beam, the second torsion arm, and the second suspension beam together surround the perimeter of the scan plate; where the first suspension beam is coupled to the intermediate support structure with a first suspension connector, the first suspension connector having a front surface, and where the second suspension beam is coupled to the intermediate support structure with a second suspension connector, the second suspension connector having a front surface; where the first torsion arm front surface, the first suspension beam front surface, the first suspension connector front surface, the second torsion arm front surface, the second suspension beam front surface, and the second suspension connector front surface are all substantially coplanar and are all offset from the scanning surface by distance greater than 0.2 mm; and wherein the scan plate, first torsion arm, first suspension beam, first suspension connector, second torsion arm, second suspension beam and second suspension connector are all patterned from a unitary MEMS semiconductor substrate.

In another embodiment, a Microelectromechanical systems (MEMS) scanner is provided, comprising: a scan plate, the scan plate including a scanning surface and an intermediate support structure extending away from scanning surface, the scan plate having a perimeter; a first torsion arm coupled to a first suspension beam, the first torsion arm having a front surface, and the first suspension beam having a front surface; a second torsion arm coupled to a second suspension beam, the second torsion arm having a front surface, and the second suspension beam having a front surface; where the first torsion arm, the first suspension beam, the second torsion arm, and the second suspension beam together surround the perimeter of the scan plate; where the first suspension beam is coupled to the intermediate support structure with a first suspension connector, the first suspension connector having a front surface, and where the second suspension beam is coupled to the intermediate support structure with a second suspension connector, the second suspension connector having a front surface; where the scanning surface, the first torsion arm front surface, the first suspension beam front surface, the second torsion arm front surface, and the second suspension beam front surface, are all substantially coplanar and are all offset from the first suspension connector front surface and the second suspension connector front surface by distance greater than 0.2 mm; and wherein the scan plate, first torsion arm, first suspension beam, first suspension connector, second torsion arm, second suspension beam and second suspension connector are all patterned from a unitary MEMS semiconductor substrate.

In the preceding detailed description, reference was made to the accompanying drawings that show, by way of illustration, specific embodiments in which the invention may be practiced. These embodiments were described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The preceding detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A microelectromechanical systems (MEMS) scanner, comprising:
    a scan plate, the scan plate including a scanning surface and an intermediate support structure extending away from scanning surface, the scan plate having a perimeter;
    a first torsion arm coupled to a first suspension beam and a second torsion arm coupled to a second suspension beam, where the first torsion arm, the first suspension beam, the second torsion arm, and the second suspension beam together extend around the perimeter of the scan plate, where the first suspension beam is coupled to the intermediate support structure at a first point offset from the scanning surface by distance greater than 0.2 mm, and where the second suspension beam is coupled to the intermediate support structure at a second point offset from the scanning surface by distance greater than 0.2 mm; and
    wherein the scan plate, first torsion arm, first suspension beam, second torsion arm, and second suspension beam are all formed from a unitary MEMS semiconductor substrate.

2. The MEMS scanner of claim 1, wherein the first suspension beam is additionally coupled to the intermediate support structure at the second point, and wherein the second suspension beam is additionally coupled to the intermediate support structure at the first point.

3. The MEMS scanner of claim 1, wherein the intermediate support structure includes a plurality of ribs, the plurality of ribs under the scan plate, and wherein the plurality of ribs are arranged in a direction perpendicular to a rotation axis of the first torsion arm and the second torsion arm.

4. The MEMS scanner of claim 1, wherein the scanning surface has a diameter, and wherein the first point is offset from the scanning surface a distance greater than 10% of the scanning surface diameter.

5. The MEMS scanner of claim 1, wherein the first torsion arm has a first front surface, and wherein the first front surface is offset from the scanning surface.

6. The MEMS scanner of claim 5, wherein the first front surface is offset from the scanning surface by a distance greater than 0.2 mm.

7. The MEMS scanner of claim 5, wherein the scanning surface has a diameter, and wherein the first front surface is offset from the scanning surface a distance greater than 10% of the scanning surface diameter.

8. The MEMS scanner of claim 1, wherein the first torsion arm has a first front surface, and wherein the first front surface is substantially coplanar with the scanning surface.

9. The MEMS scanner of claim 1, wherein the first suspension beam is coupled to the intermediate support structure through a first suspension connector structure, and wherein the first suspension beam has a front surface, the first suspension connector structure has a front surface, and wherein the first suspension beam front surface and first suspension connector structure front surface are both substantially coplanar and offset from the scanning surface.

10. The MEMS scanner of claim 9, wherein the first suspension beam front surface and first suspension connector front surface are both offset from the scanning surface by a distance of at least 0.2 mm.

11. The MEMS scanner of claim 9, wherein the scanning surface has a diameter, and wherein the first suspension beam front surface and first suspension connector front surface are both offset from the scanning surface by a distance greater than 10% of the scanning surface diameter.

12. The MEMS scanner of claim 1, wherein the first suspension beam is coupled to the intermediate support structure through a suspension connector structure, and wherein the first suspension beam has a front surface, the first suspension connector has a front surface, and wherein the first suspension beam front surface and scanning surface are substantially coplanar, and wherein the first suspension connector front surface is offset from scanning surface front surface.

13. A microelectromechanical systems (MEMS) scanner, comprising:
    a scan plate, the scan plate including a scanning surface and an intermediate support structure extending away from scanning surface, the scan plate having a perimeter;
    a first torsion arm coupled to a first suspension beam, the first torsion arm having a front surface, and the first suspension beam having a front surface;
    a second torsion arm coupled to a second suspension beam, the second torsion arm having a front surface, and the second suspension beam having a front surface;
    where the first torsion arm, the first suspension beam, the second torsion arm, and the second suspension beam together surround the perimeter of the scan plate;
    where the first suspension beam is coupled to the intermediate support structure with a first suspension connector, the first suspension connector having a front surface, and where the second suspension beam is coupled to the intermediate support structure with a second suspension connector, the second suspension connector having a front surface;
    where the first torsion arm front surface, the first suspension beam front surface, the first suspension connector front surface, the second torsion arm front surface, the second suspension beam front surface, and the second suspension connector front surface are all substantially coplanar and are all offset from the scanning surface by distance greater than 0.2 mm; and
    wherein the scan plate, first torsion arm, first suspension beam, first suspension connector, second torsion arm, second suspension beam and second suspension connector are all patterned from a unitary MEMS semiconductor substrate.

14. The MEMS scanner of claim 13, wherein the intermediate support structure includes a plurality of ribs, the plurality of ribs under the scan plate, and wherein the plurality of ribs are arranged in a direction perpendicular to a rotation axis of the first torsion arm and the second torsion arm.

15. A microelectromechanical systems (MEMS) scanner, comprising:
- a scan plate, the scan plate including a scanning surface and an intermediate support structure extending away from scanning surface, the scan plate having a perimeter;
- a first torsion arm coupled to a first suspension beam, the first torsion arm having a front surface, and the first suspension beam having a front surface;
- a second torsion arm coupled to a second suspension beam, the second torsion arm having a front surface, and the second suspension beam having a front surface;
- where the first torsion arm, the first suspension beam, the second torsion arm, and the second suspension beam together surround the perimeter of the scan plate;
- where the first suspension beam is coupled to the intermediate support structure with a first suspension connector, the first suspension connector having a front surface, and where the second suspension beam is coupled to the intermediate support structure with a second suspension connector, the second suspension connector having a front surface;
- where the scanning surface, the first torsion arm front surface, the first suspension beam front surface, the second torsion arm front surface, and the second suspension beam front surface, are all substantially coplanar and are all offset from the first suspension connector front surface and the second suspension connector front surface by distance greater than 0.2 mm; and
- wherein the scan plate, first torsion arm, first suspension beam, first suspension connector, second torsion arm, second suspension beam and second suspension connector are all patterned from a unitary MEMS semiconductor substrate.

16. The MEMS scanner of claim 15, wherein the intermediate support structure includes a plurality of ribs, the plurality of ribs under the scan plate, and wherein the plurality of ribs are arranged in a direction perpendicular to a rotation axis of the first torsion arm and the second torsion arm.

\* \* \* \* \*